United States Patent [19]

Chaudhuri et al.

[11] Patent Number: 4,741,925

[45] Date of Patent: May 3, 1988

[54] METHOD OF FORMING SILICON NITRIDE COATING

[75] Inventors: Arun K. Chaudhuri, Stratham, N.H.; Vinod K. Sarin, Lexington; Joseph M. Harris, Topsfield, both of Mass.

[73] Assignee: GTE Products Corporation, Stamford, Conn.

[21] Appl. No.: 95,985

[22] Filed: Sep. 14, 1987

[51] Int. Cl.$^4$ .............................................. B05D 7/22
[52] U.S. Cl. ..................................... 427/231; 427/233; 427/237; 427/238; 427/251; 427/252; 427/253; 427/255; 427/255.2; 427/294; 118/730
[58] Field of Search ............... 427/233, 237, 231, 238, 427/251-253, 294, 255.2, 255; 118/730

[56] References Cited

U.S. PATENT DOCUMENTS

| | | | |
|---|---|---|---|
| 4,058,579 | 11/1977 | Laskway | 427/255.2 |
| 4,610,896 | 9/1986 | Veltri | 427/255.2 |
| 4,699,825 | 10/1987 | Sakai et al. | 427/255.2 |

Primary Examiner—Janyce A. Bell
Attorney, Agent, or Firm—James Theodosopoulos

[57] ABSTRACT

A silicon nitride coating is deposited on the inside surface of a crucible by pyrolysis. Reactive gases are fed through a tube into the crucible. The crucible is rotated during deposition and the crucible walls are maintained at a temperature of at least about 1250° C.

8 Claims, No Drawings

METHOD OF FORMING SILICON NITRIDE COATING

This invention concerns formation of a silicon nitride coating on the inner surface of a crucible. Such a coating can be advantageous, for example, in a quartz crucible that is used for melting silicon and drawing a silicon crystal therefrom in order to prevent contamination of the silicon.

U.S. Pat. No. 3,746,569 discloses the pyrolysis formation of a silicon nitride coating on the walls of a quartz tube. The formation is accomplished at a temperature of 800° to 900° C. The coating formed thereby is insufficiently resistant and requires subsequent tempering at a temperature of about 1200° C.

This invention discloses a process for forming a silicon nitride coating in one step, without the need of a subsequent tempering step. This invention also can eliminate the need of axially displacing the crucible during deposition in order to obtain a uniform coating.

In this process, a tube is directed into about the axis of a crucible, terminating above the closed end of the crucible. There are peripheral holes around the tube so that gas flowing out therefrom is directed toward the bottom and inside walls of the crucible.

The size and location of the holes are controlled so that the coating deposited on the entire inner surface of the crucible is substantially uniform. The temperature of the crucible walls is maintained above about 1250° C. so that the silicon nitride coating deposited thereon is alpha crystalline, which is a more resistant form than amorphous silicon nitride. Amorphous silicon nitride forms deposition at a lower temperature.

The gases fed into the tube comprise reactive gases containing silicon and nitrogen which will react at the hot crucible surface to form and deposit silicon nitride thereon.

In one example, a quartz crucible 8" in diameter by 6" high was coated as follows. The crucible was placed inside a graphite sleeve having an inside diameter of about 8" by a height of 9". The graphite sleeve was then placed in a reaction chamber 12" in diameter by 18" high. There were resistance heating elements made of graphite around the outside of the graphite sleeve. There was carbon felt insulation surrounding the heating elements, between the heating elements and the walls of the reaction chamber. A closed end stainless steel tube, $\frac{1}{4}$" outside diameter, extended into the crucible, terminating about 2" above the bottom of the crucible. There were a plurality of 1/16" diameter holes, about $\frac{1}{8}$" apart, around the periphery of the tube, extending from the end of the tube upwards about 3". The reactive gases fed into the crucible were silicon tetrachloride and ammonia. Since silicon tetrachloride is a liquid at room temperature, hydrogen was used as a carrier gas for the silicon tetrachloride. An enhancer gas, hydrogen chloride, was also introduced, the purpose of which is to smoothen the silicon nitride coating formed on the inside crucible surface. The crucible is rotated during deposition of the coating. The total gas pressure inside the system is maintained at 10 to 30 torr. At flow rates per hour of 6 to 13 pounds silicon tetrachloride, 0.144 pounds ammonia, 325 cubic feet hydrogen and 0.4 pounds hydrogen chloride, a silicon nitride coating thickness of 2 to 5 mils could be obtained in one to four hours. The coating obtained was alpha silicon nitride, was very adherent, was nearly theoretical density and did not have pinholes. During silicon crystal pulling operation, the coating maintained its identity without lifting, peeling or cracking.

Other carrier gases that could be used instead of hydrogen are helium or argon. Another enhancer gas that could be used instead of hydrogen chloride is nitrogen, or a mixture of both.

If desired, a thin layer of silicon could be deposited by, for example, sputtering or vapor deposition, on the silicon nitride coating to act as a barrier between the molten silicon and the silicon nitride coating.

Another type of crucible that could be coated with a silicon nitride coting as per this invention is a slip cast silicon nitride crucible. The silicon nitride used in making such a crucible could contain additives to promote sintering. Such additives could be detrimental to the material, for example, silicon, to be melted in the crucible. The silicon nitride coating would be a protective barrier in such a case.

We claim:

1. The method of depositing a silicon nitride coating on the inside surface of a crucible comprising the steps of: disposing the crucible inside a reaction chamber; positioning a closed end tube axially within the crucible, the tube having a plurality of peripheral holes at the lower end thereof; introducing reactive gases into the tube and out through the peripheral holes to the inside surface of the crucible where the gases react to produce and deposit silicon nitride coating; rotating the crucible during deposition to obtain uniformity of coating; maintaining crucible temperature during deposition of at least about 1250° C. so that the coating deposited on the crucible surface is alpha crystalline silicon nitride.

2. The method of claim 1 wherein the reactive gases comprise ammonia and silicon tetrachloride.

3. The method of claim 2 wherein a carrier gas is used for the silicon tetrachloride.

4. The method of claim 3 wherein the carrier gas comprises hydrogen, helium or argon.

5. The method of claim 1 wherein an enhancer gas is introduced with the reactive gases to smoothen the silicon nitride coating.

6. The method of claim 5 wherein the enhancer gas comprises hydrogen chloride or nitrogen.

7. The method of claim 1 including the step of maintaining a pressure of 10 to 30 torr within the reaction chamber during deposition.

8. The method of claim 1 including the step of depositing a layer of silicon on the silicon nitride coating.

* * * * *